United States Patent [19]
Gromer et al.

[11] Patent Number: 5,495,661
[45] Date of Patent: Mar. 5, 1996

[54] APPARATUS FOR EQUIPPING PRINTED CIRCUITED BOARDS

[75] Inventors: Kurt Gromer, Kraichtal; Franz Haan, Bruchsal; Werner Jung, Waghaeusel-Wi; Friedrich Pedall, Karlsdorf-Neuthard-K, all of Germany

[73] Assignee: Siemens Aktiengesellschaft, Munich, Germany

[21] Appl. No.: 827,020

[22] Filed: Jan. 28, 1992

[30] Foreign Application Priority Data

Jan. 28, 1991 [DE] Germany ............ 41 02 461.3

[51] Int. Cl.⁶ ................................................. H05K 3/30
[52] U.S. Cl. ................................ 29/740; 29/759
[58] Field of Search ............... 29/740, 741, 832, 29/836–840, 759

[56] References Cited

U.S. PATENT DOCUMENTS

| | | |
|---|---|---|
| 4,202,092 | 1/1979 | Shibasaki et al. |
| 4,274,196 | 6/1981 | Lemmer .................... 29/741 |
| 4,520,557 | 6/1985 | Harigane et al. .......... 29/740 |
| 4,578,010 | 10/1986 | Harigane et al. |
| 4,694,570 | 11/1985 | Rudolph et al. |

FOREIGN PATENT DOCUMENTS

| | | |
|---|---|---|
| 0389048 | 3/1990 | European Pat. Off. |
| 2744235 | 9/1977 | Germany. |
| 3221808 | 6/1982 | Germany. |

*Primary Examiner*—Carl E. Hall
*Attorney, Agent, or Firm*—Hill, Steadman & Simpson

[57] ABSTRACT

An apparatus for automatically equipping printed circuit boards with components includes at least two equipping heads arranged stationarily at a distance from one another. A printed circuit board displacement apparatus moves corresponding printed circuit boards simultaneously into corresponding equipping positions relative to the equipping heads. Each equipping head is actuated when the printed circuit board allocated to that equipping head is moved into the corresponding equipping position. After the equipping program has been executed, the printed circuit boards are clocked for work by one equipping head division so that an unequipped printed circuit board is supplied to the first equipping head in the conveying direction and a completely equipped printed circuit board is discharged from the last equipping head. This spatially separate, serial equipping of the printed circuit boards enables the equipping heads to be reloaded when they are not actively engaged in executing an equipping event.

14 Claims, 4 Drawing Sheets

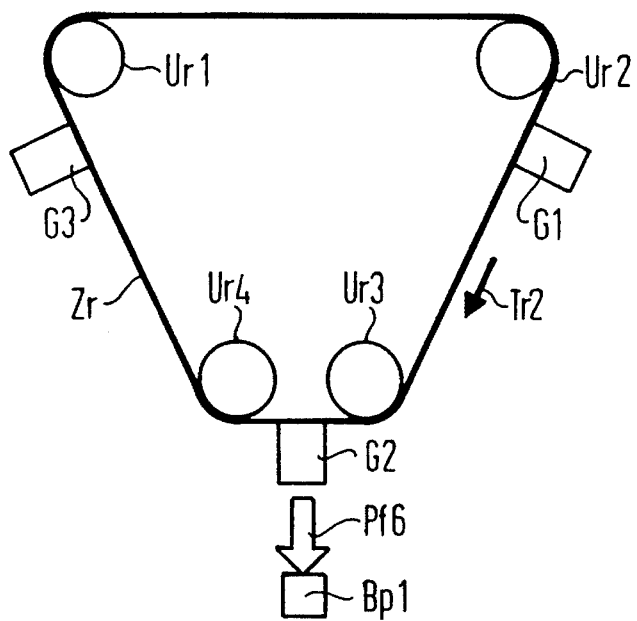
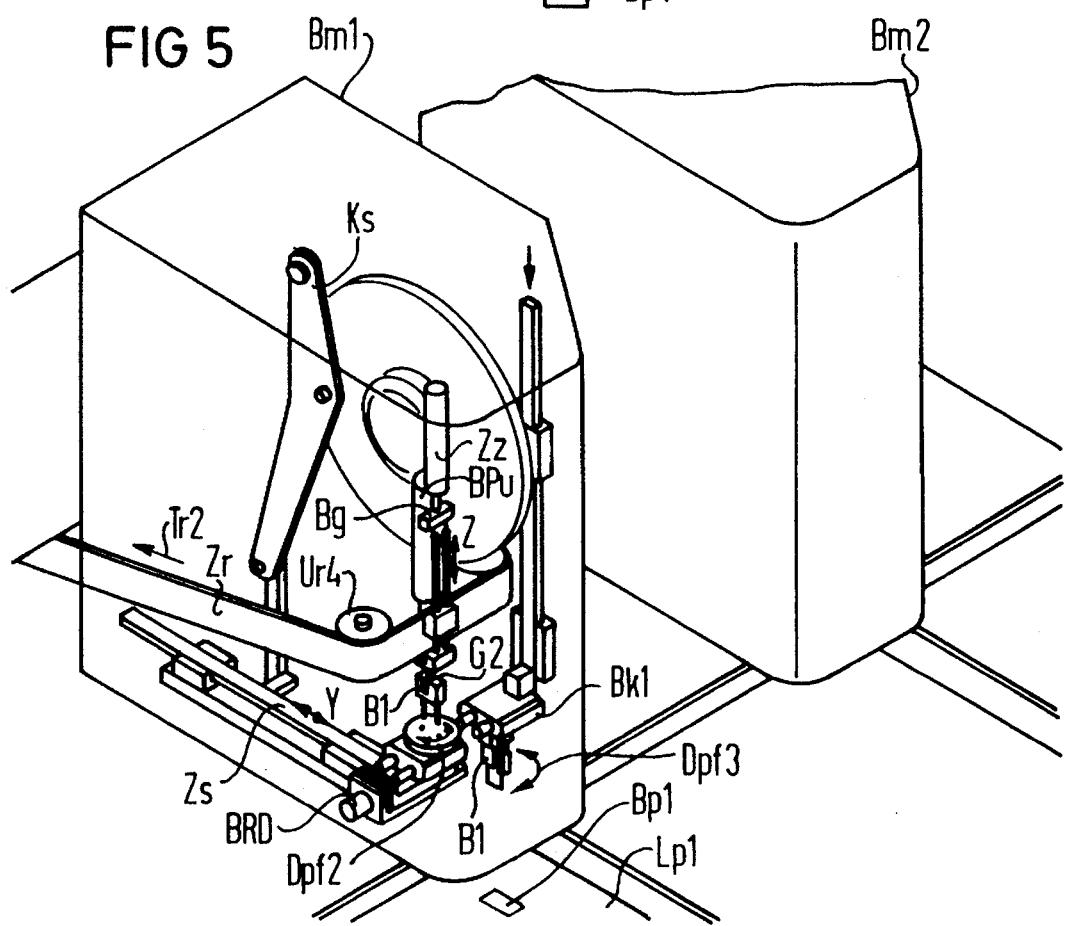

APPARATUS FOR EQUIPPING PRINTED CIRCUITED BOARDS

BACKGROUND OF THE INVENTION

1. Field of the Invention

The present invention relates generally to an apparatus for automatic mounting of circuit components on a printed circuit board and, more particularly, to an apparatus for supplying components to a printed circuit board equipping head.

2. Description of the Related Art

The equipping of printed circuit boards with electrical or electronic components is carried out either manually or through the use of automatic equipping units. In all equipping processes, even those using wired components, the individual component is prepared in a separate work step before the subsequent circuit board equipping step. The wired components then have their wires, or leads, plugged into bores in the printed circuit board which are provided for the components. When mounting non-wired components, such as SMD (surface mount device) components, on the printed circuit boards, the individual components are pressed in the correct position onto group points or into solder paste. The application of the group points or of the solder paste to the circuit board has been performed in a previous work step.

Given the mounting of wired components onto the circuit boards, the leads or wires of the component project through the bores in the circuit board and beyond the underside of the circuit board and are usually cut to a functionally proper length after the end of the equipping process. The components are prevented from falling out of the printed circuit board by bending of the leads over at the back side of the circuit board.

In known apparatus for equipping printed circuit boards, the component is picked up from a component processing and testing location by an equipping head and is centered in a correct position in the equipping head for a subsequent equipping event. When the printed circuit boards are equipped with SMD components, an X/Y coordinate table is usually used to position the component held in the equipping head over the prescribed equipping position on a stationarily positioned printed circuit board. In an apparatus for equipping circuit boards with wired components which require a tool mounted below the table (a so-called under table tool) for cutting the wires, or leads, to length and bending the portions of the leads extending through the circuit board, the printed circuit board is moved under a stationarily positioned equipping head by a compound table that is displaceable in the X and Y directions. In both instances, the equipping event is then carried out by lowering the equipping head so that the component is exactly positioned on the printed circuit board. In some automatic equipping units using robotic technology, the equipping head and the under table tool are moved into the equipping position on a removably arranged printed circuit board.

One disadvantage of the automatic equipping units which have previously been present in the marketplace is the serial execution of the component preparation, in the component testing, in the grasping of the components, and in the equipping of the components on the circuit boards. This serial execution is a result of using only one equipping head per machine.

Apparatus are also known which include multiple equipping heads provided on a turret head, the turret head being secured to an X/Y coordinate drive. The length of time required for the serial equipping event can ben greatly reduced with this known apparatus by performing a component collecting motion and a subsequent component equipping function of the multiple equipping head. The spectrum of components which can be processed with such an apparatus, however, is greatly restricted due to the special limitation of the positioning system with reference to an equipping position of the components on the circuit board. The use of under table tools required for equipping a printed circuit board with wired components is not functionally possible in the known multiple equipping head apparatus.

All known automatic equipping units involve special solutions adapted to specific types of components. A multitude of different automatic equipping units is consequently required for mounting the entire spectrum of electrical and electronic components. The different automatic equipping units have completely different basic structures. The equipping, or component mounting, times for the automatic equipping units usually is approximately several seconds per component when the time required for changing the printed circuit boards is included in the equipping sequence.

SUMMARY OF THE INVENTION

An object of the present invention is to provide a flexible apparatus for equipping printed circuit boards in economically short equipping times with an entire spectrum of components. The apparatus for equipping printed circuit boards comprises at least two equipping modules arranged at a distance from one another that are equipped with equipping heads for positioning the components at prescribed equipping positions on the printed circuit boards. A printed circuit board displacement means by which all printed circuit boards simultaneously allocated to the printing heads are simultaneously moved into mutually corresponding equipping positions is also provided, wherein each of the equipping heads is actuable when an equipping position for that equipping head over the allocated printed circuit board is reached. A printed circuit board conveyer means for clock, or step-by-step, conveying of the printed circuit boards from equipping module to equipping module is also provided, wherein an unequipped printed circuit board is supplied to the first equipping module relative to a conveying direction at every clock cycle and a completely equipped printed circuit board is discharged from the last equipping module at every clock cycle.

In the apparatus of the present invention, the component equipping means is spatially divided into a number of equipping modules that function autonomously. Each of the equipping modules has a printed circuit board allocated to it, all of the printed circuit boards being secured on a printed circuit board displacement means that moves in the X and Y directions and that executes program-controlled equipping motions in common with all of the printed circuit boards in the equipping means. When the printed circuit board displacement means approaches a calibration point with freely selectable X and Y coordinates and when all equipping heads move into this position relative to the printed circuit boards allocated to them, then all of the equipping heads have their center axis incident on the same coordinate point of the corresponding printed circuit boards provided to the equipping modules. All of the equipping coordinates of a printed circuit board can thus be covered by the printed circuit board displacement means. When the equipping coordinates for mounting a particular component on the circuit boards are reached by all the equipping heads, the appertaining equipping head which mounts that component is activated to mount that component at that location on the circuit board allocated to that equipping head. All of the circuit boards are then moved simultaneously to place another of the circuit boards into an equipping position relative to another of the equipping heads. The entire equipping volume of a printed circuit board is thereby set in serial succession, the equipping volume being the total volume of the components which are to mounted on the circuit board. The equipping volume, however, is distributed at spatially separate locations on the printed circuit boards allocated to the equipping modules. It is also of critical significance here that every equipping position for the components on the circuit boards can be individually modified by modification of the software without modification of the hardware.

When all of the printed circuit boards allocated to the equipping modules are equipped with the components from the allocated equipping modules, in other words, when the equipping program has been executed, the circuit boards are forwarded by one module interval, or division, by the printed circuit board conveyer means. Somewhat more of the equipping volume of each printed circuit board is then applied in steps with every clock cycle. A printed circuit board is completely equipped when it has been moved by clock steps passed all of the equipping modules. The clocked motion is also used for loading and unloading of the apparatus, in other words so that an unequipped printed circuit board is supplied to the apparatus and a completely equipped printed board is discharged from the apparatus with every clock cycle.

An advantage achieve by the present invention is that the spatially separate, serial equipping of a printed circuit board enables a parallel reloading of the equipping heads when the heads are not actively executing an equipping event. During this time span, the autonomously working equipping modules can also undertake the preparation of individual components for a later equipping step.

According to a development of the invention, it is especially simple to provide a compound table as the printed circuit board displacement means. Such compound table is displaceable in two directions lying perpendicular relative to one another, in other words in the X and Y directions.

Another development is directed to a simply constructed printed circuit board conveyer means having clock-step and fixing nippers which move the circuit boards by clock steps and which simultaneously securely fix the printed circuit boards in stationary positions during the equipping events. The printed circuit board conveyer means thereby includes a printed circuit board guide rail arranged on the printed circuit board displacement means along which the circuit boards are guided, as well as the clock-step and fixing nippers allocated to the equipping heads. On one hand, the clock and fixing nippers convey the printed circuit boards from equipping module to equipping module and, on the other hand, hold the printed circuit board relative to the printed circuit board guide rail during the equipping event. It is especially beneficial when the printed circuit board guide rail has a printed circuit board delivery rail and a printed circuit board discharge rail allocated to it. The printed circuit board delivery rail provides for the delivery of unequipped printed circuit boards to the guide rail and the printed circuit board discharge rail provides for the discharge of equipped printed circuit boards from the guide rail. The printed circuit board delivery rail, the printed circuit board guide rail, and the printed circuit board discharge rail are aligned relative to one another when the compound table is in a prescribed position. The processing of different circuit board sizes is possible by providing width-adjustable printed circuit board guide rails, the guide rails being adjustable to the different widths of different circuit boards.

Another development of the invention provides an optimum matching of the equipping modules to different structures and embodiments of electrical and electronic components. In this regard, the overall equipping modules are interchangeable and can thus be replaced by equipping modules adapted for the different components.

The possibility of optionally supplying a multitude of different but structurally similar components to each and every individual equipping module is achieved by including more than one delivery means allocated to an equipping module for offering different components in a fetching, or retrieving, position as needed to the equipping module, and to a conveyer element which takes the different components from the retrieving positions and conveys them to a transfer position for transfer to the equipping head of the equipping module. As a result, the number of components which can be processed by the apparatus can be increased without increasing the number of equipping modules.

Another development provides an extremely exact, program-controlled approach of the conveyer elements to the retrieving positions and transfer positions. In this context, at least two conveyer elements are arranged in a distance from one another attached to an endless drive, such as a belt, the spacing of these two conveyer elements being selected so that every retrieving position and every transfer position is approached by every conveyer element independently from one another in a program-controlled fashion. In other words, a programmed control means actuates the drive motor of the endless drive belt.

The endless drive is preferably a toothed belt which, if adequately precise, is significantly more economical than the use of chains and the like for an endless drive. A simple and economical solution is achieved by the use of nipper-shaped grabbers as conveying elements mounted on the endless drive which are raiseable and lowerable relative to the endless drive.

Another development provides for the preparation of the components for mounting within the respective equipping module so that the overall equipping apparatus is made extremely compact, occupying little space. In particular, the transfer position of the conveyer element includes a component alignment and rotation station integrated in the equipping module, the conveyer elements depositing the components in the alignment and rotation station for turning and aligning the components to a predetermined position and the equipping head removing the repositioned component therefrom.

A further enhancement to the flexibility of the present apparatus is achieve by providing an additional station in the equipping module for processing or testing of the components. To avoid losses of clock time, this additional station, which is neither in the retrieving position nor the transfer position, is not independently approached in program-controlled fashion. In this regard, three conveyer elements are arranged spaced from one another and are attached to the endless drive. The additional station for processing or testing of the components is arranged between the retrieving position and transfer position of the conveyer elements as viewed in the conveying direction of the endless drive so that a conveyer element approaches the additional station when another of the conveyer elements approaches the transfer station.

BRIEF DESCRIPTION OF THE DRAWINGS

Exemplary embodiments of the invention are shown in the drawings, of which:

FIG. 4 is a schematic plan view of the conveyer means according to FIG. 3 showing the delivery of a component by the conveyer element to the equipping head at the transfer position of the conveyer element;

FIG. 5 is a perspective view of an equipping head of the apparatus of FIG. 2 including an integrated aligning and rotation station for repositioning the components;

DESCRIPTION OF THE PREFERRED EMBODIMENTS

Figure 1:
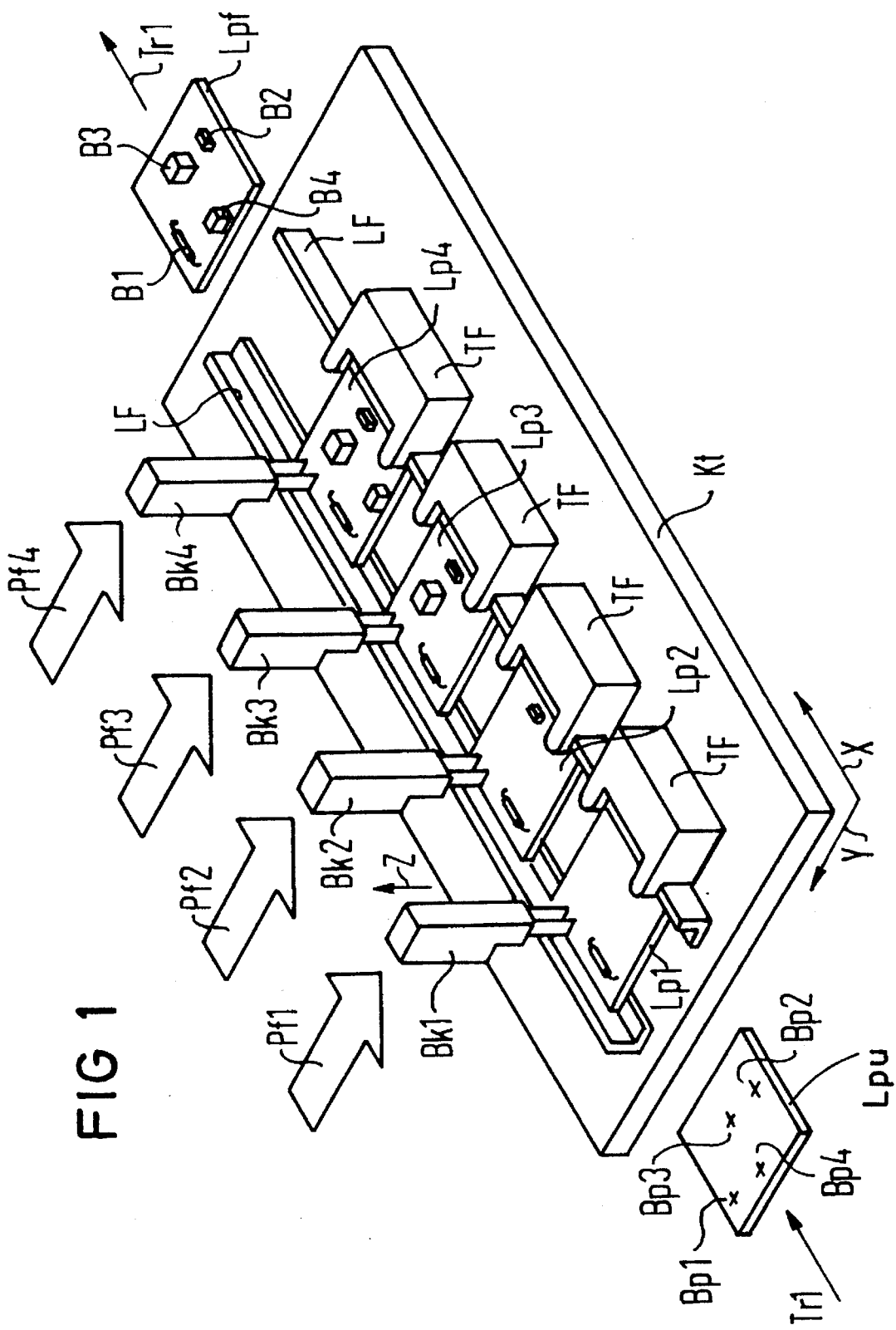
FIG. 1 is a schematic perspective view of an apparatus for equipping printed circuit boards with electrical components illustrating the principles of the present invention.

FIG. 1 shows an apparatus for equipping printed circuit boards with electronic components in a highly simplified, schematic view. The apparatus includes four equipping heads Bk1, Bk2, Bk3, and Bk4 arranged stationarily relative to one another at respective identical spacings in a row. The four equipping heads Bk1–Bk4 position components B1, B2, B3, and B4, respectively, at prescribed equipping positions Bp1, Bp2, Bp3, and Bp4 on printed circuit boards Lp1, Lp2, Lp3, and Lp4 allocated to the equipping heads. The printed circuit boards are movable from one equipping head to the next in a conveying direction Tr1 as indicated by an arrow in FIG. 1. An unequipped printed circuit board Lpu on which are indicated equipping positions Bp1, Bp2, Bp3, and Bp4 indicated by crosses is shown approaching the front of the equipping apparatus, whereas a completely equipped printed circuit board Lpf on which are mounted the components B1, B2, B3, B4 is shown following the equipping apparatus in the conveying direction. The components B1, B2, B3 and B4 are feed in parallel to the respective equipping heads Bk1, Bk2, Bk3, and Bk4 as indicated by arrows Pf1, Pf2, Pf3 and Pf4 for subsequent mounting on the circuit boards.

A compound table Kt is moveable in two perpendicular directions X and Y and is provided with printed circuit board guide rails LF proceeding in the X direction. Also on the compound table Kt are four clock and fixing nippers TF, each allocated to one of the equipping heads Bk1 through Bk4. The clock and fixing nippers TF hold the printed circuit boards Lp1 through Lp4 in position in the printed circuit board guide rail LF as shown in FIG. 1. In addition to holding the circuit boards Lp1 through Lp4, the clock and fixing nippers also displace the printed circuit boards in the X direction, or conveying direction Tr1, along the printed circuit board guide rail LF in clocked fashion by the distance between the equipping heads Bk1 through Bk4. The circuit boards are thus moved from equipping head to equipping head by the nippers TF and are held in place by the nippers as an equipping event occurs.

The printed circuit boards are equipped with the components in accordance with the following equipping steps:

1. Appropriate components B1, B2, B3 and B4 are loaded into the corresponding equipping heads Bk1, Bk2, Bk3 and Bk4, respectively, and are positioned in the appropriate placement positions. The printed circuit boards Lp1, Lp2, Lp3 and Lp4 are moved to the corresponding equipping heads Bk1, Bk2, Bk3, and Bk4, respectively, and are rigidly held in the printed circuit board guide rail LF on the compound table Kt by the corresponding nippers TF.

2. The compound table Kt is displaced in the X and Y directions until the first equipping position Bp1 on each of the printed circuit Lp1 through Lp4 is exactly situated under each of the equipping heads Bk1 through Bk4. The first equipping head Bk1 is activated so that it moves downwardly in a Z direction and places the first component B1 in the first equipping position Bp1 on the first printed circuit board Lp1. The other equipping heads Bk2 through Bk4 are not activated during this step.

3. The compound table Kt is moved in the X and Y directions until the second equipping position Bp2 on each of the printed circuit boards Lp1 through Lp4 is exactly situated under the equipping heads Bk1 through Bk4. The second equipping head Bk2 is activated so that it moves downwardly in the Z direction and places the second component B2 in the second equipping position Bp2 on the second printed circuit board Lp2. The other equipping heads Bk1, Bk3 and Bk4 are not activated during this step.

4. The compound table Kt is moved in the X and Y directions until the third equipping position Bp3 on each of the printed circuit boards Lp1 through Lp4 is exactly situated under the corresponding equipping heads Bk1 through Bk4. The third equipping head Bk3 is activated so that it moves downwardly in the Z direction and places the third component B3 in the third equipping position Bp3 on the third printed circuit board Lp3. The other equipping heads Bk1, Bk2 and Bk4 are not activated during this step.

5. The compound table Kt is displaced in the X and Y directions until the fourth equipping position Bp4 on each of the printed circuit boards Lp1 through Lp4 is exactly situated under the corresponding heads Bk1 through Bk4. The fourth equipping head Bk4 is activated so that it moves downwardly in the Z direction and places the fourth component B4 in the fourth equipping position Bp4 on the fourth printed circuit board Lp4. The other equipping heads Bk1 through Bk3 are not activated during this step.

After the steps set forth above, the printed circuit boards Lp1 through Lp4 are clocked forward by one division step in the conveying direction Tr1 by means for driving the nippers TF. The unequipped printed circuit board Lpu is, therefore, moved into position beneath the first equipping head Bk1 while the printed circuit boards Lp1, Lp2 and Lp3 are moved to positions beneath the equipping heads Bk2, Bk3 and Bk4, respectively. The printed circuit board Lp4 has now been completely equipped by undergoing the equipping steps by each of the equipping heads and is, thus, ejected from the equipping apparatus in the conveying direction Tr1.

The spatially separate, serial equipping of the circuit boards by the present apparatus enables a parallel reloading of the equipping heads Bk1 through Bk4 to be performed when the equipping heads are not actively executing an equipping event. Accordingly, all equipping heads Bk1 through Bk4 are reloaded with the corresponding components B1 through B4 after the progression of forward clock steps so that the condition set out in step 1 is again achieved. Another equipping cycle corresponding to steps 2 through 5 as set forth above is then carried out to equip the printed circuit boards Lpu and Lp1 through Lp3.

The equipping cycle set forth above may be modified so that the equipping step 5 is possibly followed by an equipping step 6 wherein a further equipping position (not shown in FIG. 1) is approached by the compound table Kt and a second one of the first components B1 is positioned in this further equipping position on the printed circuit board Lp1 by the first equipping head Bk1. Thus, two such component B1 are mounted on each of the printed circuit boards. Only after this step are the printed circuit boards clocked forward by one division spacing in the conveying direction Tr1. Of course, such additional equipping events may be executed by each of the equipping heads Bk2, Bk3, and Bk4 for components B2, B3, or B4, respectively. Other such variations on the equipping steps are of course possible under the present invention, including, for example, placing a third or more components B1 in the circuit board, adding further equipping heads for greater numbers of different components, or repeating any of the foregoing steps.

As shall be set forth later, the equipping heads Bk1 through Bk4 can also be supplied with electrically different but geometrically similar components for mounting on the circuit boards. These components are then positioned in allocated equipping positions on the printed circuit boards in corresponding equipping events before the printed circuit boards are clocked forward. Of course, equipping of the printed circuit boards based upon the above described principles can be undertaken by two, three or by more than four equipping heads.

Figure 2:
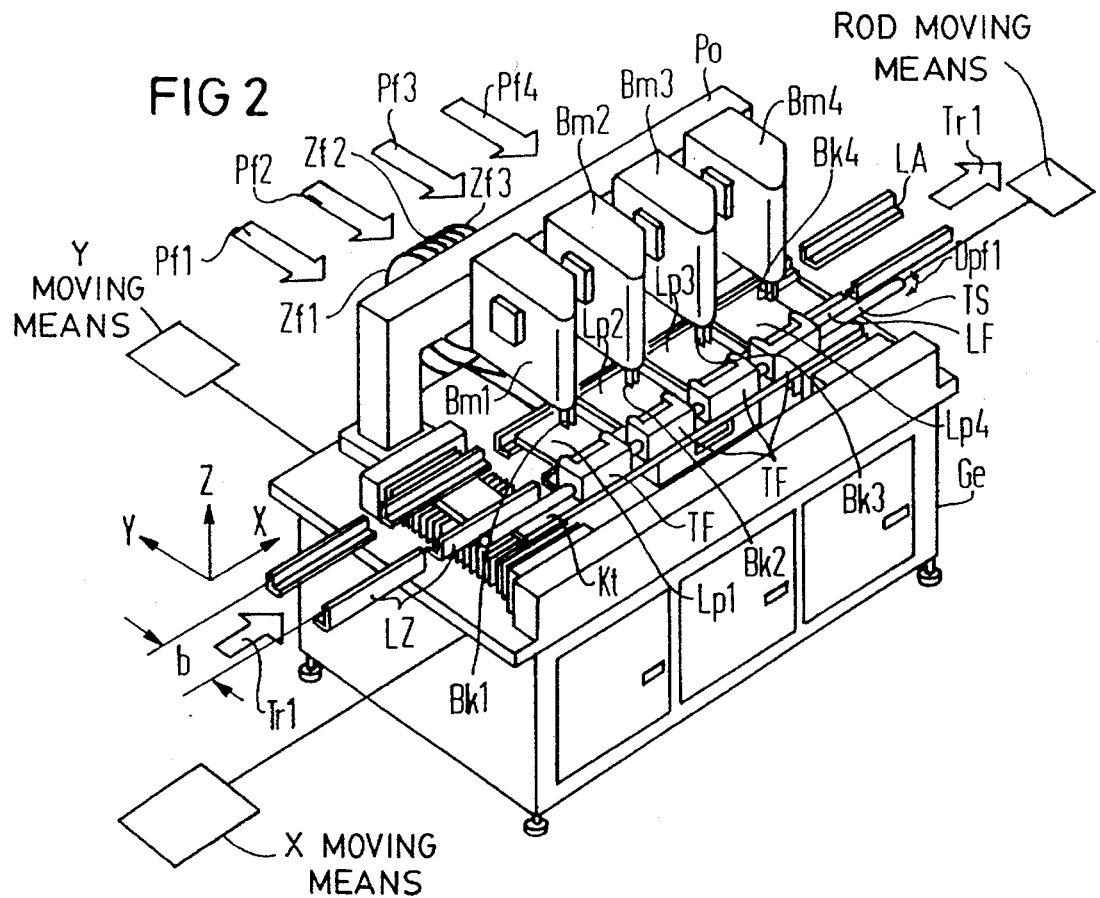
FIG. 2 is a perspective view of an apparatus for equipping printed circuit boards constructed in accordance with the operating principles shown in FIG. 1.

FIG. 2 shows an apparatus for equipping printed circuit boards which is constructed in accordance with the operating principles shown in FIG. 1. The compound table Kt, which is movable by X moving means and Y moving means, is arranged on a box-shaped base Ge which carries a portal Po in its back region. Equipping modules Bm1, Bm2, Bm3, and Bm4 are interchangeable connected to the portal Po and each of the equipping heads Bk1, Bk2, Bk3, and Bk4 are situated in the corresponding equipping modules Bm1 through Bm4. Three delivery means Zf1, Zf2 and Zf3 for axially wired, belted components are provided at the back side of the portal Po, the delivery means Zf1 through Zf3 supplying the first equipping module Bm1 with the appropriate components via a conveyer means, which shall be described in conjunction with FIGS. 3 through 5.

As already mentioned in conjunction with FIG. 1, the printed circuit boards Lp1 through Lp4 allocated to the corresponding equipping modules Bm1 through Bm4 are advanced by one module spacing, or division, in common along the printed circuit board guide rail LF as soon as one cycle of the equipping program has been executed. This clocked feed of the printed circuit boards in the conveying direction Tr1 occurs by simultaneously moving all of the clock and fixing nippers TF first back and then forth in the X direction. This is accomplished by mounting the nippers TF along a conveyer rod TS that can be moved longitudinally by a rod moving means. For engaging and releasing the printed circuit boards Lp1 through Lp4, the clock and fixing nippers TF are pivoted by turning the conveyer rod TS around its longitudinal axis in the direction of a double arrow Dpf1 shown in FIG. 2, such as by the rod moving means.

The motion of the clock and fixing nippers TF in the X direction is also exploited for loading and unloading of the overall apparatus. To this end the printed circuit board delivery rails LZ are provided for feeding of the unequipped printed circuit board Lpu (as shown in FIG. 1) to the guide rails LF and printed circuit board discharge rails LA are provided for discharge of the completely equipped printed circuit boards Lpf (also shown in FIG. 1) from the apparatus. When the compound table Kt is in the position shown in FIG. 2, the printed circuit board delivery rails LZ, the printed circuit board guide rails LF and the printed circuit board discharge rails LA are in alignment with one another so that the transfer of the printed circuit boards therebetween can occur.

It is also schematically indicated in FIG. 2 that a width b of the printed circuit board delivery rails LZ, the printed circuit board guide rails LF, and the printed circuit board discharge rails LA is adjustable for matching to different circuit board formats.

As wired components B1 through B4 (as shown in FIG. 1) are processed by the equipping modules Bm1 through Bm4, the lead wires thereof are plugged through corresponding bores in the respective printed circuit boards LP1 through LP4 as the equipping heads Bk1 through Bk4 are lowered. An under-table tool (not visible in FIG. 2) is allocated to each equipping module Bm1 through Bm4 for cutting the portions of the lead wires that extend through the circuit boards to the required length and for fixing them in the respective circuit boards Lp1 through Lp4 by, for example, bending of the lead wires as needed.

It should be mentioned in this regard that the modular character of the autonomously working equipping modules Bm1 through Bm4 requires that only geometrically similar components be processed by each module. In other words, a certain equipping head may be used to mount components of different electrical characteristics but similar shapes, such as resisters of different resistance values, on the circuit boards. This leads to relatively simple mechanical shapes of the equipping heads and under-table tools which are optimally matched to the geometry of the corresponding components.

As already mentioned, a number of geometrically similar but electrically different components may be supplied to the equipping modules Bm1 through Bm4. To this end, the conveyer devices whose operating principles shall be set forth in conjunction with FIGS. 3 and 4 are used.

Figure 3:
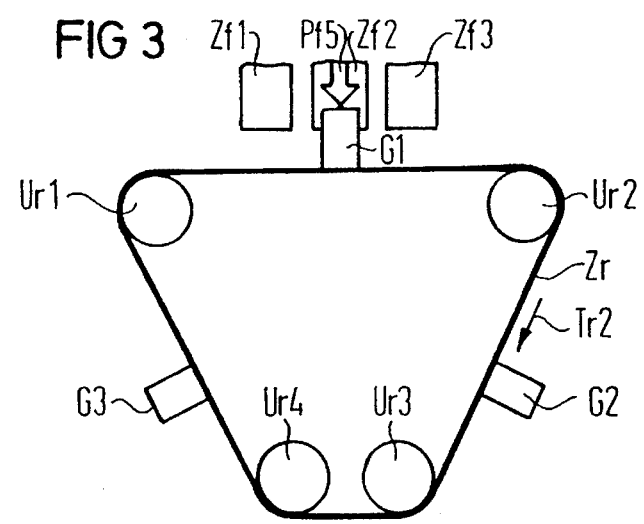
FIG. 3 is a schematic plan view of a conveyer means for delivering components to an equipping head in the apparatus shown in FIG. 2, the components being engaged by the conveyer elements in the delivery means at the retrieving position.
Figure 7:
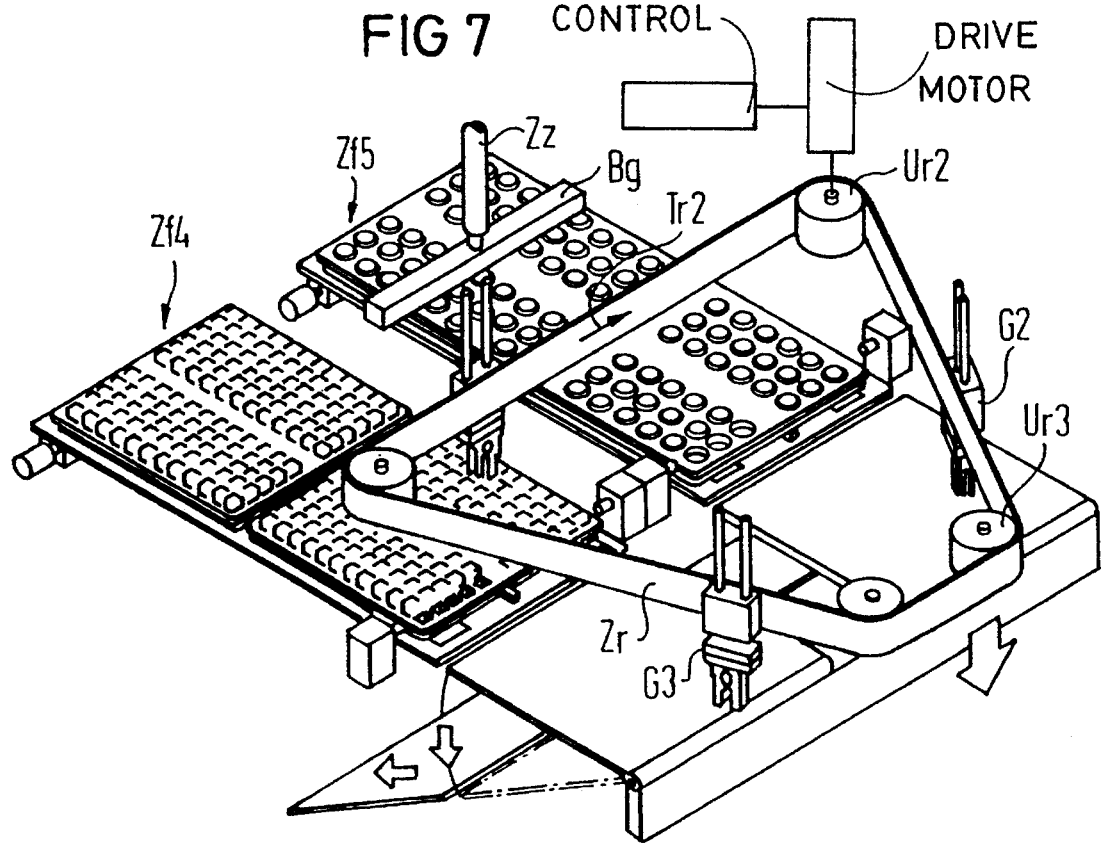
FIG. 7 is a perspective view of a conveyer means according to FIGS. 3 and 4 including two planer supply magazines arranged side-by-side to serve as component feeder devices for feeding different components to the conveyer elements.

With reference to FIG. 3, a conveyer means for use in supplying electrically different components to the equipping modules Bm1 through Bm4 includes an endless drive formed by a toothed belt Zr which is conducted about deflection rollers Ur1, Ur2, Ur3 and Ur 4 arranged at the corners of a trapezoid. The toothed belt Zr carries three nipper-shaped grabbers G1, G2 and G3 arranged spaced from one another along the belt Zr. One of the deflection rollers Ur1 through Ur4 is driven (by a drive motor as shown in FIG. 7) so that nipper-shaped grabbers G1 through G3 are moved in a conveying direction Tr2 as indicated by an arrow in FIG. 3. In the illustrated example, retrieving positions (not shown in detail) for the components being delivered by the delivery means Zf1, Zf2 and Zf3 are along the longer of the two parallel sides of the trapezoid. Each of the nipper-shaped grabbers G1 through G3 can approach each of the retrieving positions of the delivery means Zf1 through Zf3 in program-controlled fashion by the programmed control of the drive motor (see FIG. 7) and can retrieve a corresponding component therefrom. In the illustrated example of FIG. 3, the retrieving position of a middle one of the delivery means Zf2 is approached by the first nipper-shaped grabber G1 so that the nipper-shaped grabber G1 picks up a component there. The pick up of the component is indicated by an arrow Pf5 in FIG. 3. At this point in time, the second nipper-shaped grabber G2 carries a component which has been previously taken from one of the delivery means Zf1 through Zf3, while the third nipper-shaped grabber G3 is empty at this time.

After the component is picked up by the first nipper-shaped grabber G1, the toothed belt Zr is driven in program-controlled fashion in the conveying direction Tr2 so that the second grabber G2 approaches a transfer position shown schematically in FIG. 4. The transfer position in the illustrated example is midway between the deflection rollers Ur3 and Ur4 at the short parallel side of the trapezoid. In this transfer position, the grabber G2 transfers the component held therein to, for example, the first equipping head Bk1 of the equipping module Bm1 (shown in FIG. 2) which in turn places the component in the equipping position Bp1 on the allocated printed circuit board Lp1. The transfer of the component at the transfer position is indicated by an arrow Pf6 in FIG. 4. At this point in time, the first nipper-shaped grabber G1 carries the component which has previously been taken from the delivery means Zf2, while the third grabber G3 is still empty at this time.

After the above described transfer event of the component conveyed by the second nipper-shaped grabber G2 to an equipping module, the tooth belt Zr is again driven in program-controlled fashion in the conveying direction Tr2 so that the third grabber G3 approaches one of the retrieving positions of the delivery means Zf1 through Zf3 shown in FIG. 3. At this position, the third grabber G3 takes a component in a way previously described with reference to the nipper-shaped grabber G1.

In the foregoing example, three geometrically similar but electrically different components can be selectively supplied to an equipping module by approaching a corresponding one of the delivery means Zf1, Zf2, or Zf3. The program-controlled approach of the conveyer elements to the respective retrieving positions and to the transfer positions thereby ensues with extremely high precision since each is approached separately.

According to FIG. 5, the transfer of a component B1 to the first equipping head Bk1 of the equipping module Bm1 that is merely indicated by the arrow Pf6 in FIG. 4 ensues via a component aligning and rotating station BRD which is integrated in the equipping module Bm1. It may be seen that the component aligning and rotating station BRD can be moved into the transfer position by a delivery carriage Zs which is displaceable in the Y direction. The transfer position is thus approached in program-controlled fashion by the nipper-shaped grabber G2 secured to the tooth belt Zr. By actuating a gripper cylinder Zz which is rigidly arranged in the equipping module Bm1, a beam-shaped actuation element Bg thereof moves downwardly in the Z direction and thereby effects a corresponding downward motion of the nipper-shaped grabber G2 and effects a transfer of the component B1 to the component aligning and rotating station BRD which is supported by a rigidly mounted component pusher BPu. The component aligning and rotating station BRD can turn the transferred component B1 by plus/minus 180 degrees as indicated by a double arrow Dpf2. After the transfer and possible rotation of the component B1 is undertaken, the delivery carriage Zs is driven via a rocker Ks and is moved in the Y direction toward the front into the gripping position of the equipping head Bk1. A second rocker, which is not shown in FIG. 5, drives the equipping head Bk1 so that it moves down over the component B1 and grabs the component B1. In the grabbing position, the lead wires of the component B1 are brought into a defined position relative to the equipping head Bk1 of the equipping module Bm1 in a standard way, for example by plastic bending. The equipping head Bk1 then takes the component B1 from the component aligning and rotating station BRD and positions it in the equipping position Bp1 of the printed circuit board Lp1 by lowering it in the Z direction.

The component B1 which has been grabbed by the equipping head Bk1 can be turned by plus/minus 90 degrees by the equipping head Bk1, the rotation direction being indicated by a double arrow Dpf3. The combination of the ability to turn in the directions Dpf2 and Dpf3 results in the component B1 being rotatable overall by 360 degrees in 90 degree intervals.

Figure 6:
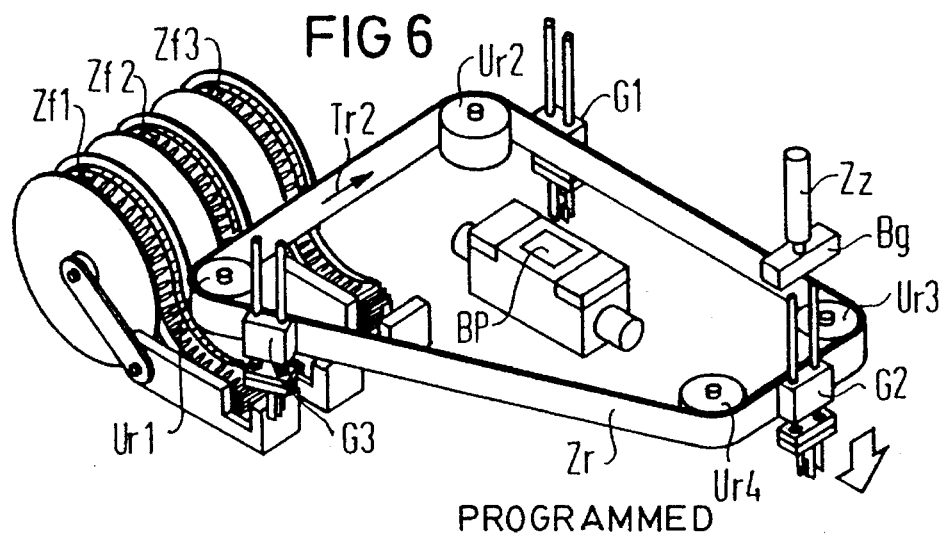
FIG. 6 is a perspective view of the conveyer means constructed in accordance with FIGS. 3 and 4 and including three delivery means arranged side-by-side for delivering three different axially wired, belted components to the conveyer elements at the retrieving position.

In FIG. 6 is shown three delivery means Zf1, Zf2 and Zf3 arranged side-by-side for delivering axially wired, belted components. The respective required components are taken from the retrieve positions of the three delivery devices Zf1, Zf2 and ZF3 by the nipper-shaped grabbers G1, G2 and G3, the delivery means Zf1, Zf2 and Zf3 being constructed in the usual way. The components are conveyed from the retrieve positions to the transfer position that, for example, is situated in the equipping module Bf1 as shown in FIG. 5. In the illustrated example, the nipper-shaped grabber G1 is situated in the transfer position. As may be seen, the spacing from the following nipper-shaped grabber G1 on the endless drive is dimensioned such that it is directly situated over an additional station BP for processing or for testing of the components when the grabber G2 has reached the transfer position in program-controlled fashion. For instances, an electrical function test of the component may be undertaken by the testing station BP. Therefore, one component is being tested at the testing station BP while the component which was just tested is mounted on the circuit board.

In FIG. 7 is shown the offering of components in two delivery devices Zf4 and Zf5 arranged side-by-side, the delivery devices being planar magazines or trays. In the illustrated example, the nipper-shaped grabber G1 has just approached in the X direction in program-controlled fashion a retrieving position allocated to the delivery Zf4 from which it then takes a corresponding component. The offering of various components in the planar magazines ensues by the displacement of the magazines in the Y direction. The actuation of the nipper-shaped grabber G2 also ensues on the basis of a stationarily arranged gripper cylinder Zz whose beamed head actuation element Bg is sufficiently wide that it covers both of the retrieving positions allocated to the delivery devices Zf4 and Zf5. For example, components such as transformers, inductors or the like which may not fit in the delivery means shown in FIG. 6 may be offered in the planar magazines of the delivery devices Zf4 and Zf5 of FIG. 7.

Thus, there is shown a printed circuit board being provided with components by at least two equipping heads arranged spaced from one another, the printed circuit boards being moved simultaneously by printed circuit board displacement devices into mutually corresponding equipping positions. The actuation of an equipping head occurs when an equipping position allocated to one of the equipping heads is reached by the corresponding printed circuit board. After the equipping program has been executed and a component installed on the circuit board, the printed circuit boards are clocked forward by one equipping head spacing so that an unequipped circuit printed circuit board is supplied to the first equipping head in the conveying direction and a completely equipped printed circuit board is discharged from the last equipping head. Spatially separate, serial equipping according to the present apparatus permit loading of the equipping heads when the equipping heads are not actively executing an equipping event.

Although other modifications and changes may be suggested by those skilled in the art, it is the intention of the inventors to embody within the patent warranted hereon all changes and modifications as reasonably and properly come within the scope of their contribution to the art.

We claim:

1. An apparatus for automatically equipping printed circuit boards with components, comprising:

equipping modules arranged at a distance from one another, each of said equipping modules including equipping heads operable to position the components at predetermined equipping positions on the printed circuit boards, said equipping heads being arranged at a predetermined substantially uniform spacing from one another;

printed circuit board displacement means for substantially simultaneously moving a plurality of the printed circuit boards so that each of said printed circuit boards are moved to a same position relative to corresponding ones of said equipping heads, one of the printed circuit boards is positioned at an equipping position relative to a selected one of said equipping heads, said printed circuit boards being maintained at a spacing from one another corresponding to said predetermined uniform spacing of said equipping heads;

means for actuating the selected one of said equipping heads when the one of the printed circuit boards has been moved to the equipping position by said printed circuit board displacement means to position the component on the one of the printed circuit boards; and printed circuit board conveyer means for clock step-by-clock step conveying of the printed circuit boards from equipping module to equipping module while maintaining said spacing of the printed circuit boards so that an unequipped circuit board is moved in a conveying direction to a first of said equipping heads and an equipped printed circuit board is discharged from a last of said equipping modules at every clock step.

2. An apparatus as claimed in claim 1, wherein said printed circuit board displacement means is a compound table supporting the plurality of printed circuit boards and having means for displacing said compound table in two perpendicular directions.

3. An apparatus as claimed in claim 1, wherein said printed circuit board conveyer means comprises:

a printed circuit board guide rail arranged on said printed circuit board displacement means;

clock and fixing nippers allocated for each of said equipping heads to hold printed circuit boards in said printed circuit board guide rail at each of said equipping heads and to move the printed circuit boards along said printed circuit board guide rail from equipping module to equipping module.

4. An apparatus as claimed in claim 3, wherein said printed circuit board guide rail is adjustable in width to accommodate different widths of printed circuit boards.

5. An apparatus as claimed in claim 1, further comprising:

a printed circuit board delivery rail mounted so as to be selectively in alignment with said printed circuit board conveyer means for delivering unequipped printed circuit boards to said printed circuit board conveyer means;

a printed circuit board discharge rail mounted so as to be selectively in alignment with said printed circuit board conveyer means for receiving equipped printed circuit boards from said printed circuit board conveyer means;

said printed circuit board displacement means being movable to a position to align said printed circuit board delivery rail with said printed circuit board conveyer means and for aligning said printed circuit board discharge rail with said printed circuit board conveyer means.

6. An apparatus as claimed in claim 1, wherein said equipping modules are interchangeable.

7. An apparatus as claimed in claim 1, wherein said equipping modules comprises:

a delivery means for supplying components to a receiving position; and a conveyer element means for receiving the components at the receiving position, conveying the components to a transfer position, and transferring the components to said equipping head at the transfer position.

8. An apparatus for automatically equipping printed circuit boards with components, comprising:

equipping modules arranged at a distance from one another, each of said equipping modules including:

an equipping head operable to position the components at predetermined equipping positions on the printed circuit boards, a delivery means for supplying components to a receiving positions, a first conveyer element means for receiving the components at the receiving position, conveying the components to a transfer position, and transferring the components to said equipping head at the transfer position, a second conveyer element means for receiving the components at the receiving position, conveying the components to a transfer position, and transferring the components to said equipping head at the transfer position;

an endless drive operable in program controlled fashion, said first and second conveyer elements being mounted on said endless drive as a predetermined distance from one another, said predetermined distance being such that one of said first and second conveyer elements is at a retrieving position when another of said first and second conveyer elements is spaced from the transfer position;

printed circuit board displacement means for substantially simultaneously moving a plurality of the printed circuit boards so that one of the printed circuit boards is moved to an equipping position relative to a selected one of said equipping heads;

means for actuating the selected one of said equipping heads when the one of the printed circuit boards has been moved to the equipping position by said printed circuit board displacement means to position the component on the one of the printed circuit boards; and printed circuit board conveyer means for clock step-by-clock step conveying of the printed circuit boards from equipping module to equipping module so that an unequipped circuit board is moved in a conveying direction to a first of said equipping heads and an equipped printed circuit board is discharged from a last of said equipping modules at every clock step.

9. An apparatus as claimed in claim 8, wherein said endless drive comprises a toothed belt.

10. An apparatus as claimed in claim 8, wherein said first and second conveyer elements comprise nipper-shaped grabbers, and means for alternately raising and lower said nipper-shaped grabbers.

11. An apparatus for automatically equipping printed circuit boards with components, comprising:

equipping modules arranged at a distance from one another, each of said equipping modules including:

equipping heads operable to position the components at predetermined equipping positions on the printed circuit boards, a delivery means for supplying components to a receiving position, a conveyer element means for receiving the components at the receiving position, conveying the components to a transfer position, and transferring the components to said equipping head at the transfer position;

printed circuit board displacement means for substantially simultaneously moving a plurality of the printed circuit boards so that one of the printed circuit boards is moved to an equipping position relative to a selected one of said equipping heads;

means for actuating the selected one of said equipping heads when the one of the printed circuit boards has been moved to the equipping position by said printed circuit board displacement means to position the component on the one of the printed circuit boards;

printed circuit board conveyer means for clock step-by-clock step conveying of the printed circuit boards from equipping module to equipping module so that an unequipped circuit board is moved in a conveying direction to a first of said equipping heads and an equipped printed circuit board is discharged from a last of said equipping modules at every clock step; and a component aligning and rotating station integrated in said equipping module at the transfer position to reposition the components, said component aligning and rotating station accepting components from said conveyer element means at the transfer position and releasing the components to equipping head after repositioning the components.

12. An apparatus as claimed in claim 8, further comprising:

a third conveyer element means for receiving the components at the receiving position, conveying the components to a transfer position, and transferring the components to said equipping head at the transfer position, said third conveyer element means being space from said first and second conveyer element means on said endless drive;

an additional station arranged in said equipping module between the receiving position and the transfer position in a direction of travel of said endless drive so that one of said conveyer elements is at said additional station when another of said conveyer elements is at the transfer position, said additional station processing the components.

13. An apparatus as claimed in claim 12, wherein said additional station is a testing station for testing of the components.

14. An apparatus for mounting electrical components on printed circuit boards, comprising:

a compound table movable in two perpendicular directions;

guide rails mounted on said compound table in parallel so that the printed circuit boards are slidably movable along said guide rails;

circuit board holding and moving means for selectively holding a plurality of the printed circuit boards in said guide rails at a predetermined distance from one another and for selectively sliding the printed circuit boards along said guide rails while maintaining said predetermined distance between the printed circuit boards;

a plurality of equipping heads spaced from one another by said predetermined distance and positioned at substantially identical positions relative to corresponding ones of the printed circuit boards, each one of said equipping heads being operable to mount a component in a corresponding printed circuit board when the printed circuit board is moved to an equipping position relative to said each one of said equipping heads by said compound table.

\* \* \* \* \*